United States Patent

Yamamura et al.

[11] Patent Number: 5,981,616
[45] Date of Patent: Nov. 9, 1999

[54] PHOTO-CURABLE RESIN COMPOSITION USED FOR PHOTO FABICATION OF THREE-DIMENSIONAL OBJECTS

[75] Inventors: Tetsuya Yamamura; Tsuyoshi Watanabe; Akira Takeuchi; Takashi Ukachi, all of Ibaraki, Japan

[73] Assignees: DSM N.V., Heerlen, Netherlands; JSR Corporation; Japan Fine Coatings Co., Ltd., both of Tokyo, Japan

[21] Appl. No.: 08/989,407

[22] Filed: Dec. 12, 1997

[51] Int. Cl.$^6$ .................................................. C08F 2/46
[52] U.S. Cl. ............................................................ 522/168
[58] Field of Search ............................................. 522/168

[56] References Cited

U.S. PATENT DOCUMENTS

| | | | |
|---|---|---|---|
| 3,835,003 | 9/1974 | Schlesinger | 204/159.11 |
| 4,139,655 | 2/1979 | Tsao | 427/44 |
| 4,374,751 | 2/1983 | Dudgeon | 252/426 |
| 4,394,403 | 7/1983 | Smith | 427/42 |
| 4,575,330 | 3/1986 | Hull | 425/174.4 |
| 4,694,029 | 9/1987 | Land | 522/8 |
| 5,073,643 | 12/1991 | Crivello | 556/64 |
| 5,387,304 | 2/1995 | Berner et al. | 156/212 |
| 5,437,964 | 8/1995 | Lapin et al. | 430/280 |
| 5,639,802 | 6/1997 | Neckers et al. | 522/25 |
| 5,721,289 | 2/1998 | Karim et al. | 522/31 |
| 5,783,358 | 6/1998 | Schulthess et al. | 430/269 |

FOREIGN PATENT DOCUMENTS

| | | |
|---|---|---|
| 0732625 A2 | 3/1996 | European Pat. Off. |
| 49-17040 | 2/1974 | Japan |
| 50-151996 | 12/1975 | Japan |
| 50-151997 | 12/1975 | Japan |
| 50-158680 | 12/1975 | Japan |
| 50-158698 | 12/1975 | Japan |
| 52-30899 | 3/1977 | Japan |
| 55-125105 | 9/1980 | Japan |
| 56-8428 | 1/1981 | Japan |
| 56-149402 | 11/1981 | Japan |
| 57-192429 | 11/1982 | Japan |
| 60-247515 | 12/1985 | Japan |
| 62-35966 | 2/1987 | Japan |
| 62-101408 | 5/1987 | Japan |
| 1-204915 | 8/1989 | Japan |
| 1-213304 | 8/1989 | Japan |
| 2-28261 | 1/1990 | Japan |
| 2-75618 | 3/1990 | Japan |
| 2-208305 | 8/1990 | Japan |
| 3-160013 | 7/1991 | Japan |
| 5-24119 | 2/1992 | Japan |
| 6-228413 | 8/1994 | Japan |
| 8-085775 | 4/1996 | Japan |
| 8-208832 | 8/1996 | Japan |
| 8-218296 | 8/1996 | Japan |
| 8-269392 | 10/1996 | Japan |
| 8-277385 | 10/1996 | Japan |

OTHER PUBLICATIONS

Japanese Patent Abstract, vol. 014, No. 261 (c–0725), Mar. 15, 1990.

*Primary Examiner*—James J. Seidleck
*Assistant Examiner*—Sanza McClendon
*Attorney, Agent, or Firm*—Pillsbury Madison & Sutro Intellectual Property Group

[57] ABSTRACT

A photocurable resin composition suitable for photofabrication. The resin composition capable of being promptly cured by photo-irradiation, thereby reducing fabricating time and providing cured products having excellent mechanical strength and minimized shrinkage during curing to ensure high dimensional accuracy. The composition includes (A) an oxetane compound, (B) an epoxy compound, and (C) a cationic photo-initiator.

15 Claims, 1 Drawing Sheet

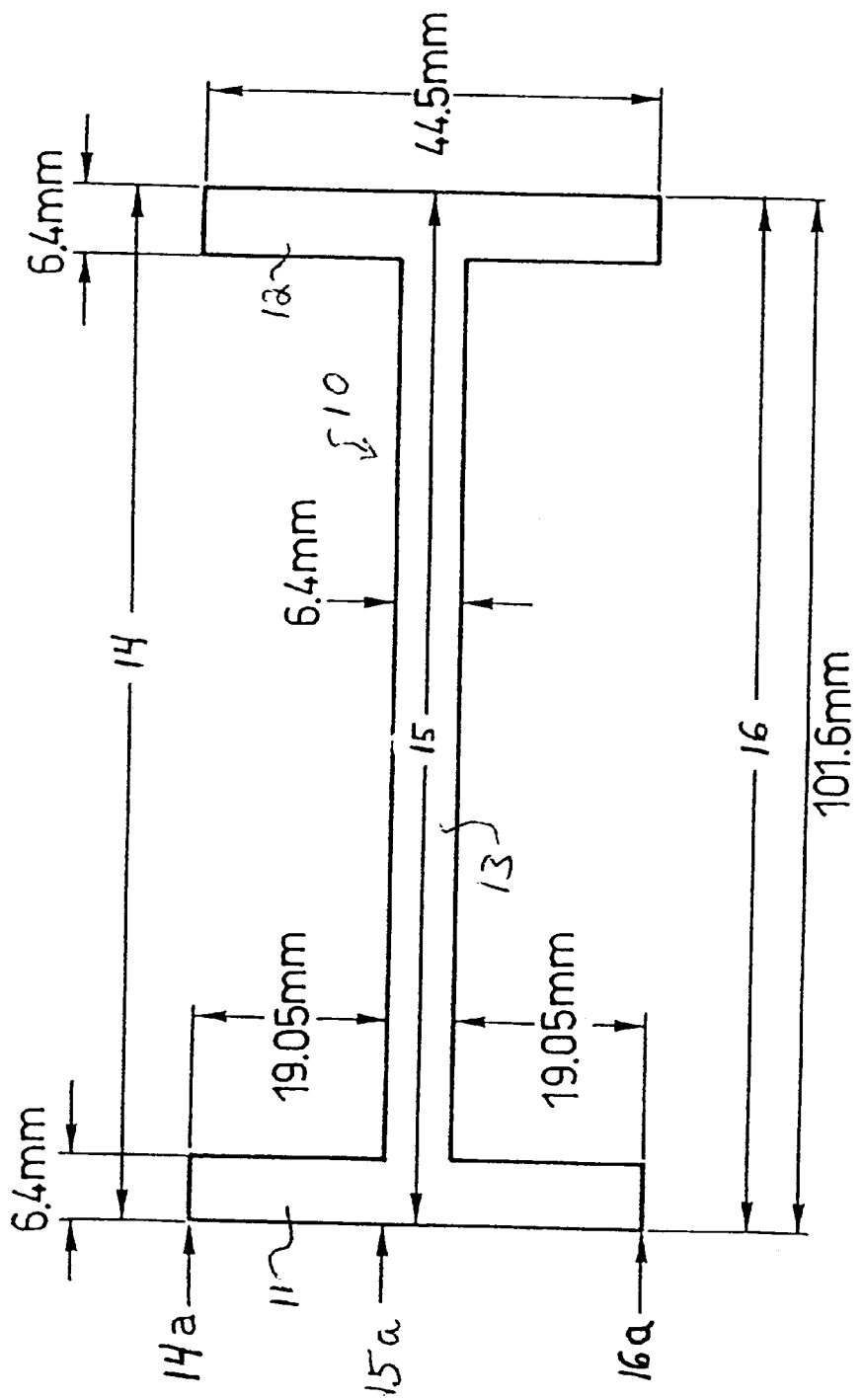

PHOTO-CURABLE RESIN COMPOSITION USED FOR PHOTO FABICATION OF THREE-DIMENSIONAL OBJECTS

FIELD OF THE INVENTION

The present invention relates to a photo-curable resin composition used for photo-fabrication of three-dimensional objects.

BACKGROUND OF THE INVENTION

In recent years, photo-fabrication processes for forming three-dimensional objects consisting of integrally laminated cured resin layers prepared by repeating a step of forming a cured resin layer by selectively irradiating a liquid photo-curable material with light have been proposed (see Japanese Patent Application Laid-open No. 247515/1985, U.S. Pat. No. 4,575,330 (Japanese Patent Application Laid-open No. 35966/1987), Japanese Patent Application Laid-open No. 101408/1987, Japanese Patent Application Laid-open No. 24119/1993).

A typical example of such a photo-fabrication process comprises forming a curable resin layer having a specified pattern by selectively irradiating with light using, for example, an ultraviolet radiation laser on the surface of a liquid photo-curable material (photo-curable resin composition) in a container, feeding the photo-curable resin composition equivalent to one layer to form another thin layer of the composition over this cured resin layer, and selectively irradiating this thin layer with light to form a new cured resin layer which is integrally laminated over the previously formed cured resin layer. This step is repeated a number of times, with or without changing the pattern in which the light is irradiated to form a three-dimensional object consisting of integrally laminated multiple cured resin layers. This photo-fabrication process has been attracting considerable attention, because the target three-dimensional object can easily be prepared in a short period of time even if it has a complicated shape.

The following resin compositions (A) to (C) represent photo-curable resin compositions conventionally used in the photo-fabrication process.

(A) Resin compositions containing a radically polymerizable organic compound such as urethane(meth)acrylate, oligoester(meth)acrylate, epoxy(meth)acrylate, thiol-ene compounds, photosensitive polyimide, and the like (see Japanese Patent Applications Laid-open No. 204915/1989, No. 208305/1990, and No. 160013/1991).

(B) Resin compositions containing a cationically polymerizable organic compound such as an epoxy compound, cyclic ether compound, cyclic lactone compound, cyclic acetal compound, cyclic thioether compound, spiro-orthoester compound, vinylether compound, and the like (see Japanese Patent Application Laid-open No. 213304/1989).

(C) Resin compositions containing a radically polymerizable organic compound and a cationically polymerizable organic compound(see Japanese Patent Applications Laid-open No. 28261/1990, No. 75618/1990, and No. 228413/1994).

The characteristics required of the photo-curable resin composition used for these photo-fabrication processes include a low viscosity to quickly form a smooth liquid surface and the capability of being rapidly cured by irradiation with light. Also, the required characteristics of the photo-curable resin composition are minimal swelling of the cured products and minimal deformation due to shrinkage during curing with light, so as to minimize the production of defective parts such as warped parts, indented parts (sinkmark), or stretched parts (overhanging parts).

Three-dimensional objects prepared by photo-fabrication methods have conventionally been used for design models, trial mechanical parts for confirming the functionality, or masters for molds. In order to use this process for trial mechanical parts, it is important that the three-dimensional object has high dimensional accuracy in accordance with the design in fine processing, mechanical strength and heat resistance sufficient to withstand conditions of use.

However, no conventional resin composition can satisfy the above demands. The three-dimensional objects obtained, for example, from the above-mentioned resin composition (A), which is a resin composition containing a radical polymerizable organic compound, such as urethane(meth)acrylate, oligoester(meth)acrylate, or epoxy(meth)acrylate, exhibit problems of deformation with the passage of time, such as production of warped parts, or indented parts, or stretched parts (overhanging parts), because of residual strain due to the shrinkage during curing. These problems of deformation with the passage of time can be partly solved by the correction of the input data to the CAD. However, CAD corrections are insufficient to compensate for modern trial mechanical parts which have intricate and complicated shapes, or for circumstantial variations of use.

The above-mentioned conventional resin composition (B) include a cationically photo-polymerizable compound containing an epoxy compound have drawbacks that the photo-curing rate of the resin solution is lower than that of resin compositions including a radically photo-polymerizable compound in photo-fabrication processes, necessitating the processing time to be prolonged. Also, three-dimensional objects prepared by photo-fabrication using resin compositions including a cationically photo-polymerizable compound containing a conventionally known epoxy compound are not provided with sufficient toughness required for the trial mechanical parts used for confirming the functionality.

Only an insufficient photo-curing rate can be provided using even hybridized photo-curing resin compositions including, for example, (meth)acrylate monomer which is the above-mentioned radically photo-polymerizable compound (C), and an epoxy compound which is a cationically photo-polymerizable compound.

The present invention has been achieved in view of this situation and has an object of providing a photo-curable resin composition used for photo-fabrication, which can be rapidly cured to ensure reduction in the period of time required for photo-fabrication processes. Also, the present invention has an object of providing a photocurable composition used for photo-fabrication, which can provide three-dimensional objects which have high toughness and dimensional accuracy.

SUMMARY OF THE INVENTION

The above object can be attained in the present invention by a photo-curable resin composition used for photo-fabrication of three-dimensional objects comprising, (A) an oxetane compound, (B) an epoxy compound, and (C) a cationic photo-initiator.

BRIEF DESCRIPTION OF THE DRAWINGS

FIGURE is a front elevation view of a three-dimensional object for evaluating the fabricating capability of the resin compositions prepared in the Examples and the Comparative Examples.

DETAILED DESCRIPTION OF THE INVENTION AND PREFERRED EMBODIMENTS

The present invention will now be explained in detail.

(A) Oxetane Compound

A compound having an oxetane ring (herein referred to as an oxetane compound) is employed as Component (A) of the photo-curable resin composition of the present invention. The oxetane compound of the present invention is a compound having one or more oxetane rings represented by the following formula (1). This compound can be polymerized or crosslinked by radiation from light in the presence of a cationic photo-initiator.

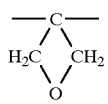 (1)

The oxetane compound h may contain 1 or more oxetane groups. Preferably, the compound has less than 20, and in particular less than 10 oxetane groups. In particularly preferred embodiments, the oxetane compound has two oxetane groups. It may also be useful to use mixtures of oxetane compounds, in particular those having 1, 2, 3, 4 or 5 oxetane groups.

The oxetane compound preferably has a molecular weight of about 100 or more, preferably of about 200 or more. Generally, this compound will have a molecular weight of about 10,000 or lower, preferably of about 5,000 or lower.

In one embodiment of the invention, the oxetane groups preferably constitute the terminus of radiation curable oligomers having a phenyl, (oligo)-bis-phenyl, polysiloxane or polyether, backbone. Examples of polyethers are poly-THF, polypropylene glycol, alkoxylated trimethylolpropane, alkoxylated pentaerythritol and the like.

Preferably, the oxetane compound has one or more groups according to formula (2):

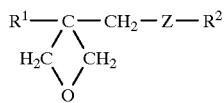 (2)

in which Z is oxygen or sulfur, most preferably oxygen, and in which $R^1$ and $R^2$ constitute the remainder of a molecule.

Examples of the compound having one oxetane ring used as component (A) are the compounds represented by the above formula (2), wherein Z represents an oxygen atom or a sulfur atom, $R_1$ represents a hydrogen atom; fluorine atom; alkyl group having from 1 to 6 carbon atoms such as a methyl group, ethyl group, propyl group, butyl group, or the like; fluoroalkyl group having from 1 to 6 carbon atoms such as a trifluromethyl group, perfluoroethyl group, perfluoropropyl group, or the like; aryl group having from 6 to 18 carbon atoms such as a phenyl group, naphthyl group, or the like; furyl group, or thienyl group, and $R^2$ represents a hydrogen atom, alkyl group having from 1 to 6 carbon atoms such as a methyl group, ethyl group, propyl group, butyl group, or the like; alkenyl group having from 2 to 6 carbon atoms such as a 1-propenyl group, 2-propenyl group, 2-methyl-1-propenyl group, 2-methyl-2-propenyl group, 1-butenyl group, 2-butenyl group, 3-butenyl group, or the like; aryl group having from 6 to 18 carbon atoms such as a phenyl group, naphthyl group, anthonyl group, phenanthryl group, or the like; aralkyl group having from 7 to 18 carbon atoms which may be either substituted or unsubstituted, such as a benzyl group, fluorobenzyl group, methoxybenzyl group, phenethyl group, styryl group, cinnamyl group, ethoxybenzyl group, or the like; group having other aromatic groups such as an aryloxyalkyl group including a phenoxymethyl group, phenoxyethyl group or the like; alkylcarbonyl group having from 2 to 6 carbon atoms such as an ethylcarbonyl group, propylcarbonyl group, butylcarbonyl group, or the like; alkoxycarbonyl group having from 2 to 6 carbon atoms such as an ethoxycarbonyl group, propoxycarbonyl group, butoxycarbonyl group, or the like; or N-alkylcarbamoyl group having from 2 to 6 carbon atoms such as an ethylcarbamoyl group, propylcarbamoyl group, butylcarbamoyl group, pentylcarbamoil group, or the like.

The oxetane compounds having two oxetane rings, include, for example, those compounds represented by the following formula (3):

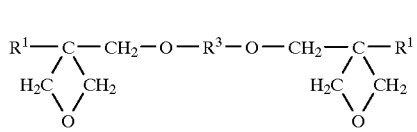 (3)

wherein $R^1$ independently represents a group represent by formula (2), $R^3$ represents a linear or branched alkylene group having from 1 to 20 carbon atoms such as an ethylene group, propylene group, butylene group, or the like; linear or branched poly(alkylenoxy) group having from 1 to 120 carbon atoms such as poly(ethylenoxy) group, poly(propylenoxy) group, or the like; linear or branched unsaturated hydrocarbon group such as a propenylene group, methylpropenylene group, butenylene group, or the like; carbonyl group, alkylene group containing a carbonyl group, alkylene group containing a carboxyl group in the middle of a molecular chain, and alkylene group containing a carbamoyl group in the middle of a molecular chain. Also, in the formula (3), $R^3$ may be a polyvalent group represented by any one of the following formulas (4)–(6).

 (4)

wherein Ø represents a phenyl ring, $R^4$ represents an alkyl group having from 1 to 4 carbon atoms such as a methyl group, ethyl group, propyl group, butyl group, or the like; alkoxy group having from 1 to 4 carbon atoms such as a methoxy group, ethoxy group, propyoxy group, butoxy group, or the like; halogen atom such as a chlorine atom, bromine atom, or the like; nitro group, cyano group, mercapto group, lower alkylcarboxyl group, carboxyl group, or carbamoyl group, and x is an integer of from 0 to 4.

 (5)

wherein $R^5$ represents an oxygen atom, sulfur atom, methylene group, and groups represented by the formulae —NH—, —SO—, —$SO_2$—, —$C(CF_3)_2$—, or —$C(CH_3)_2$—.

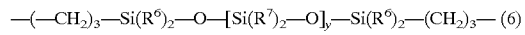 (6)

wherein $R^6$ represents an alkyl group having from 1 to 4 carbon atoms such as a methyl group, ethyl group, propyl group, butyl group, or the like, or aryl group having from 6 to 18 carbon atoms such as a phenyl group, naphthyl group, or the like, y denotes an integer of from 0 to 200, and $R^7$ represents an alkyl group having from 1 to 4 carbon atoms such as a methyl group, ethyl group, propyl group, butyl group, or the like or aryl group having from 6 to 18 carbon atoms such as a phenyl group, naphthyl group, or the like. Alternatively, $R^7$ may be a group represented by the following formula (7).

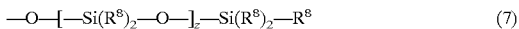

wherein $R^8$ represents an alkyl group having from 1 to 4 carbon atoms such as a methyl group, ethyl group, propyl group, butyl group, or the like, or aryl group having from 6 to 18 carbon atoms such as a phenyl group, naphthyl group, or the like, and z is an integer of from 0 to 100.

Given as examples of the compounds having two oxetane rings are the compounds represented by the following formulas (8)–(10).

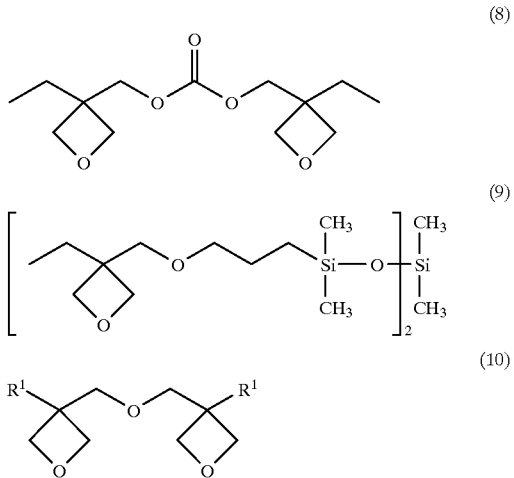

wherein $R^1$ represents the same group as defined in the formula (2).

As examples of compounds having three or more oxetane rings, the compounds represented by the formula (2) as described above, wherein $R^2$ is a polyfunctional organic group with a valence of from 3 to 10, such as linear or branched alkylene groups having from 1 to 30 carbon atoms or linear or branched disiloxane or polysiloxane groups. Suitable examples of polyfunctional compounds include linear or branched poly(alkyleneoxy) groups, for example, alkoxylated trimethylolpropane, or linear or branched polysiloxane containing groups with 2–10 dimethyl siloxane groups.

Examples of alkylene groups having a valence of 3 or more include trimethylol alkane in which the alkyl group has from 1 to 6 carbon atoms such as a methyl group, ethyl group, propyl group, or the like, pentaerythritol, dipentaerythritol, glucose, and the like.

Also, given as specific examples of the compounds having three or more oxetane rings are the compounds represented by the following formula (11).

Other useful compounds include polysiloxanes with pendant groups according to formula (2).

In addition to the above examples, the compound having oxetane rings used as component(A) may include compounds with a high molecular weight, e.g. a number average molecular weight reduced polystyrene of 1,000 to 5,000, measured using gel permeation chromatography. Examples of such compounds are compounds in which $R^1$ of formula (2) is e.g. methyl, ethyl or propyl, and in which $R^2$ polyethyleneglycol with a polymerisation degree of between 20–200, compounds according to formula (3) in which $R^3$ is polyTHF, or compounds which are based on alkoxylated pentaerythritol and the like.

Given as specific examples of the compounds having an oxetane ring used as component (A) are the following compounds:

Compounds Having One Oxetane Ring

Typical examples of the compounds having one oxetane ring are as follows.
3-ethyl-3-hydroxymethyloxetane
3-(meth)-allyloxymethyl-3-ethyloxetane
(3-ethyl-3-oxetanylmethoxy)methylbenzene
4-fluoro-[1-(3-ethyl-3-oxetanylmethoxy)methyl]benzene
4-methoxy-[1-(3-ethyl-3-oxetanylmethoxy)methyl]-benzene
[1-(3-ethyl-3-oxetanylmethoxy)ethyl]phenyl ether
isobutoxymethyl(3-ethyl-3-oxetanylmethyl) ether
isobornyloxyethyl(3-ethyl-3-oxetanylmethyl) ether
isobornyl(3-ethyl-3-oxetanylmethyl) ether
2-ethylhexyl(3-ethyl-3-oxetanylmethyl) ether
ethyldiethylene glycol (3-ethyl-3-oxetanylmethyl) ether
dicyclopentadiene (3-ethyl-3-oxetanylmethyl) ether
dicyclopentenyloxyethyl(3-ethyl-3-oxetanylmethyl) ether
dicyclopentenyl(3-ethyl-3-oxetanylmethyl) ether
tetrahydrofurfuryl(3-ethyl-3-oxetanylmethyl) ether
tetrabromophenyl(3-ethyl-3-oxetanylmethyl) ether
2-tetrabromophenoxyethyl(3-ethyl-3-oxetanylmethyl) ether
tribromophenyl(3-ethyl-3-oxetanylmethyl) ether
2-tribromophenoxyethyl(3-ethyl-3-oxetanylmethyl) ether
2-hydroxyethyl(3-ethyl-3-oxetanylmethyl) ether
2-hydroxypropyl(3-ethyl-3-oxetanylmethyl) ether
butoxyethyl (3-ethyl-3-oxetanylmethyl) ether
pentachlorophenyl(3-ethyl-3-oxetanylmethyl) ether
pentabromophenyl(3-ethyl-3-oxetanylmethyl) ether
bornyl(3-ethyl-3-oxetanylmethyl) ether Compounds Having Two or More Oxetane Rings Typical examples of the compounds having two or more oxetane rings are as follows.
3,7-bis(3-oxetanyl)-5-oxa-nonane
3,3'-(1,3-(2-methylenyl)propanediylbis-(oxymethylene))-bis-(3-ethyloxetane)
1,4-bis[(3-ethyl-3-oxetanylmethoxy)methyl]benzene
1,2-bis[(3-ethyl-3-oxetanylmethoxy)methyl]ethane
1,3-bis[(3-ethyl-3-oxetanylmethoxy)methyl]propane
ethylene glycol bis(3-ethyl-3-oxetanylmethyl) ether
dicyclopentenylbis(3-ethyl-3-oxetanylmethyl) ether
triethylene glycol bis(3-ethyl-3-oxetanylmethyl) ether
tetraethylene glycol bis(3-ethyl-3-oxetanylmethyl) ether
tricyclodecanediyldimethylene bis(3-ethyl-3-oxetanylmethyl) ether

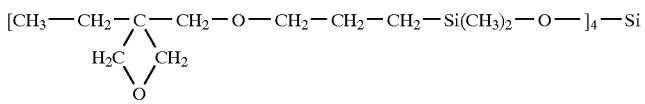

trimethylolpropane tris(3-ethyl-3-oxetanylmethyl) ether
1,4-bis(3-ethyl-3-oxetanylmethyl)butane
1,6-bis(3-ethyl-3-oxetanylmethoxy)hexane
pentaerythritol tris(3-ethyl-3-oxetanylmethyl) ether
pentaerythritol tetrakis (3-ethyl-3-oxetanylmethyl) ether
polyethylene glycol bis(3-ethyl-3-oxetanylmethyl) ether
dipentaerythritol hexakis(3-ethyl-3-oxetanylmethyl) ether,dipentaerythritol pentakis(3-ethyl-3-oxetanylmethyl) ether
dipentaerythritol tetrakis(3-ethyl-3-oxetanylmethyl) ether
caprolactone modified dipentaerythritol hexakis(3-ethyl-3-oxetanylmethyl) ether
caprolactone modified dipentaerythritol pentakis(3-ethyl-3-oxetanylmethyl) ether
ditrimethylolpropane tetrakis(3-ethyl-3-oxetanylmethyl) ether
EO modified bisphenol A bis(3-ethyl-3-oxetanylmethyl) ether
PO modified bisphenol A bis(3-ethyl-3-oxetanylmethyl) ether
EO modified hydrogenated bisphenol A bis(3-ethyl-3-oxetanylmethyl) ether
PO modified hydrogenated bis(3-ethyl-3-oxetanylmethyl) ether
EO modified bisphenol F bis(3-ethyl-3-oxetanylmethyl) ether These compounds may be used either individually or in combinations of two or more.

Among these, preferred compounds having oxetane rings, which can be used as component (A) contained in the resin composition of the present invention, are (3-ethyl-3-oxetanylmethoxy)methylbenzene shown by the formula (12) illustrated below, 1,4-bis[(3-ethyl-3-oxetanylmethoxy)-methyl]benzene shown by the formula (13) illustrated below, 1,2-bis(3-ethyl-3-oxetanylmethoxy)ethane shown by the formula (14) illustrated below, trimethylolpropane tris (3-ethyl-3-oxetanylmethyl) ether shown by the formula (15) illustrated below, and the compounds represented by formula (16) shown below.

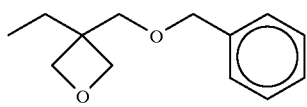

(12)

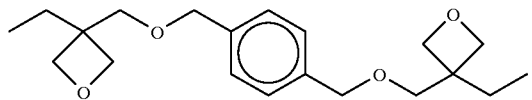

(13)

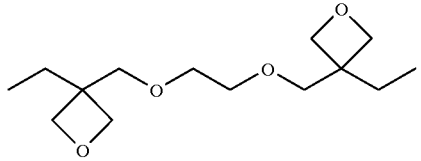

(14)

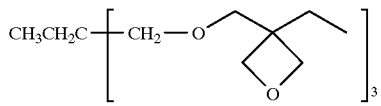

(15)

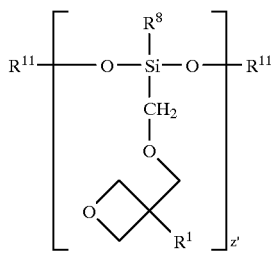

(16)

wherein $R^1$ represents the same group as defined in the formula (2), $R^8$ represents the same group as defined in the formula (7), $R^{11}$ represents an alkyl group having from 1 to 4 carbon atoms such as a methyl group, ethyl group, propyl group, butyl group, or the like or a trialkylsilyl group, wherein the alkyl groups may be either the same or different and have from 3 to 12 carbon atoms, such as a trimethylsilyl group, triethylsilyl group, tripropylsilyl group, or tributyl-silyl group, and z' is an integer from 1 to 10.

These compounds having oxetane rings may be used either individually or in combinations of two or more.

The proportion of component (A) in the resin composition of the present invention is usually 30–97% by weight, preferably 40–96% by weight, and more preferably 50–95% by weight. If the proportion of component (A) is too low, the rate (curing rate) of the cationic polymerization reaction is so reduced that molding time may be extended and the resolution may tend to be lower. On the other hand, if the proportion of component (A) is too high, there are tendencies that the toughness of the cured product is lower and the rate (curing rate) of the cationic polymerization reaction is reduced.

(B) Epoxy Compound

A compound having an epoxy group (herein referred to as an epoxy compound) is employed as Component (B) of the photo-curable resin composition of the present invention. Preferably, the epoxy compound of the present invention is a compound having an epoxy group and a number average molecular weight reduced to polystyrene of 1,000–20,000, preferably 1,500–10,000, and more preferably 2,000–5,000, measured using gel permeation chromatography. The molecular weight of this range is preferable to improve the characteristics of the resin composition, such as the viscosity of the resin composition, the period of time required for photo-fabrication, and the toughness of the cured product.

Examples of epoxy compounds suitable for the present invention are (1) epoxidated compounds obtained by a process which comprises epoxidating a double bond between carbons of a corresponding compound having an ethylenically unsaturated bond using an appropriate oxidizing agent such as hydrogen peroxide or peroxy acid process (1); (2) polymers having an epoxy group prepared by a process which comprises polymerizing a radically polymerizable monomer containing an epoxy group in a molecule process (2); and (3) compounds having an epoxy group prepared by a known process, e.g. a process comprising reacting a compound having a functional group, e.g. hydroxyl group, with epichlorohydrin process (3).

In order to prepare compounds having an epoxy group preferably used as component(B), which have a number average molecular weight reduced to polystyrene of 1,000–20,000, a compound having a number average molecular weight of 1,000–20,000 may be used as the raw material compound having an ethylenically unsaturated bond when using the above process (1). When using the process (2), a known method may be used to prepare a polymer with a desired polymerization degree. Also, when using the process (3), a compound having a number average molecular weight reduced to polystyrene of 1,000–20,000 may be used as the raw material compound having a functional group, e.g. hydroxyl group.

Given as typical examples of the epoxidated compounds of above-mentioned (1) are polymers of conjugated diene monomers, copolymers of conjugated diene monomers and compounds having an ethylenically unsaturated bond, copolymers of diene monomers and compounds having an ethylenically unsaturated bond, and compounds prepared by epoxidating a copolymer such as natural rubber. More particularly, examples of these compounds are compounds produced by epoxidating a polymer of conjugated diene monomers such as a butadiene monomer or isoprene monomer; compounds prepared by epoxidating a copolymer of a conjugated diene monomer and a compound having an ethylenically unsaturated bond, e.g. ethylene, propylene, butene, isobutylene, styrene; compounds prepared by epoxidating a copolymer of a compound having an ethylenically unsaturated bond and a diene monomer, e.g. dicyclopentadiene; and compounds prepared by epoxidating a double bond contained in the molecule of rubber and the like. Commercially available epoxidated polybutadiene products incluyde Poly bd R-45 EPI (manufactured by Idemitsu Petrochemical Co., Ltd.), R-15EPI, R-45EPI (manufactured by Nagase Chemicals Ltd.), and Epolead PB3600, PB4700 (manufactured by Daicel Chemical Industries Ltd.). Given as examples of commercially available products of epoxidated compounds of a butadiene-styrene copolymer are Epofriend ESBS AT014, AT015, AT000 (manufactured by Daicel Chemical Industris Ltd.).

Given as examples of the polymer of the above-mentioned process (2) having an epoxy group are homopolymers produced from monomers such as glycidyl (meth)acrylate, vinylcyclohexene oxide, 4-vinylepoxycyclohexane, 3,4-epoxycyclohexylmethyl (meth)acrylate, or caprolactone modified 3,4-epoxycyclohexylmethyl (meth)acrylate, and copolymers of these monomers and other vinyl monomers. The number average molecular weight of these compounds is in the range of 1,000–20,000 as converted into polystyrene.

Given as examples of the compounds of the above-mentioned process (3) having an epoxy group prepared by the reaction of a compound having a functional group such as a hydroxyl group and epichlorohydrin are compounds prepared by the reaction of polybutadiene having hydroxyl groups at both terminals and epichlorohydrin.

Given as examples of commercially available products of the compounds of the above-mentioned process (3) are Poly bd R-45 EPT (manufactured by Idemitsu Petrochemical Co., Ltd.), and R-15EPT, R-45EPT (manufactured by Nagase Chemicals Ltd.). The number average molecular weight reduced to polystyrene of these compounds is in the range of 1,000–20,000. Among these examples of the compounds having an epoxy group, Poly bd R-45 EPI, R-15 EPI, R-45 EPI, and Epolead PB3600, PB4700 are preferable for use as component (B).

The above epoxy compounds may be used as component (B) either individually or in combinations of two or more.

The proportion of component (B) in the resin composition of the present invention is usually 3–50% by weight, preferably 4–40% by weight, and more preferably 5–30% by weight. If the proportion of component (B) is too low, the rate (curing rate) of the cationic polymerization reaction is so reduced that molding time may be extended and the resolution and toughness of the cured product may tend to be reduced. On the other hand, if the proportion of component (B) is too high, the viscosity the resin composition is increased and molding time may tend to be prolonged.

(C) Cationic Photo-initiator

The cationic photo-initiator (hereinafter may be called from time to time component (C)) contained in the resin composition of the present invention is a compound capable of generating a molecule initiating cationic polymerization of components (A) and (B) upon exposure to radiation such as light.

Given as especially preferred examples of the cationic photo-initiator are onium salts repsresented by the following formula (17), which are compounds releasing Lewis acid on exposure to light:

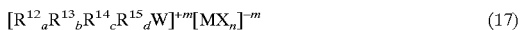

$$[R^{12}_a R^{13}_b R^{14}_c R^{15}_d W]^{+m}[MX_n]^{-m} \quad (17)$$

wherein the cation is an onium ion; W represents S, Se, Te, P, As, Sb, Bi, O, I, Br, Cl, or N≡N; $R^{12}$, $R^{13}$, $R^{14}$, and $R^{15}$ represent individually the same or different organic group; a, b, c, and d independently represent an integer from 0 to 3, and provided that a+b+c+d is equal to the valence number of W. M represents a metal or metalloid which constitutes a center atom of a halide complex. Typical examples of M are B, P, As, Sb, Fe, Sn, Bi, Al, Ca, In, Ti, Zn, Sc, V, Cr, Mn, and Co. X represents a halogen atom such as a fluorine atom, chlorine atom, or bromine atom. m is a substantial electric charge of the halide complex ion and n is the valence of M.

Given as typical examples of the onium salts represented by the formula (17) are diphenyliodonium, 4-methoxydiphenyliodonium, bis(4-methylphenyl) iodonium, bis(4-tert-butylphenyl)iodonium, bis (dodecylphenyl)-iodonium, triphenylsulfonium, diphenyl-4-thiophenoxy-phenylsulfonium, bis[4-(diphenylsulfonio)-phenyl]-sulfide, bis[4-(di(4-(2-hydroxyethyl)phenyl) sulfonio)-phenyl]sulfide, and $\eta^5$-2,4-(cyclopentadienyl)-[(1, 2,3,4,5,6-\eta)-(methylethyl)-benzene]-iron(1+).

Given as specific examples of the negative ion ($MX_n^-$) in the above formula (17) are tetrafluoroborate ($BF_4^-$), hexafluorophosphate ($PF_6^-$), hexafluoroantimonate ($SbF_6^-$), hexafluoroarsenate ($AsF_6^-$), and hexachloroantimonate ($SbCl_6^-$).

Also, onium salts represented by the general formula $[MX_n(OH)^-]$ (wherein M, X, and n are the same as defined in formula (17)) can be used instead of those represented by the formula $[MX_n]$. Further, onium salts including a negative ion, for example, perchloric acid ion ($ClO_4^-$), trifluoromethane sulfonate ion ($CF_3SO_3^-$), fluorosulfonate ion ($FSO_3^-$), toluene sulfonate ion, trinitrobenzene sulfonate negative ion, and trinitrotoluene sulfonate ion, are given as other examples of onium salts.

Further, aromatic onium salts can be used as the cationic photo-initiator (C). Among these aromatic onium salts, the following compounds are preferred: aromatic halonium salts described, for example, in Japanese Patent Applications Laid-open No. 151996/1975 and No. 158680/1975; VIA group aromatic onium salts described, for example, in Japanese Patent Applications Laid-open No. 151997/1975, 30899/1977, No. 55420/1981, and No. 125105/1980; VA group aromatic onium salts described, for example, in Japanese Patent Application Laid-open No. 158698/1975; oxosulfoxonium salts described, for example, in Japanese Patent Applications Laid-open No. 8428/1981, No. 149402/1981, and No. 192429/1982; aromatic diazonium salts described, for example, in Japanese Patent Application Laid-open No. 17040/1974; and thiopyrylium salts described in the specification of U.S. Pat. No. 4,139,655. Iron/allene complex and aluminium complex/photo-decomposable silica compound initiators are also given as examples of the onium salts.

Preferred examples of commercially available products of the cationic photo-initiator which can be used as component (B) are UVI-6950, UVI-6970(bis[4-(di(2-hydroxyethyl) phenyl)sulfonio]-phenylsulfide), UVI-6974 (bis[4-diphenylsulfonio)-phenyl]sulfidebishexafluoro-antimonate, UVI-6990 (hexafluorophosphate salt of UVI-6974) (manufactured by Union Carbide Corp), Adekaoptomer SP-151, SP-170 (bis[4-(di(4-(2-hydroxyethyl)phenyl) sulfonio]-phenylsul fide), SP-171 (manufactured by Asahi Denka Kogyo Co., Ltd.), Irgacure 261 ($\eta^5$-2,4-(cyclopentadien-1-yl)-[(1,2,3,4,5,6-$\eta$)-(1-methylethyl) benzene]-iron(1+)-hexafluorophosphate(1−)) (manufactured by Ciba Geigy), CI-2481, CI-2624, CI-2639, CI-2064 (manufactured by Nippon Soda Co., Ltd.), CD-1010, CD-1011, CD-1012 (4-(2-hydroxytetra-decanyloxy)-diphenyliodonium hexafluoroantimonate (manufactured by Sartomer Co., Ltd.), DTS-102, DTS-103, NAT-103, NDS-103 ((4-hydroxynaphthyl)-dimethylsulfonium hexafluoroantimonate), TPS-102 (triphenylsulfonium hexafluoroantimonate), TPS-103 (triphenylsulfonium hexafluoroantimonate), MDS-103 (4-methoxyphenyl-diphenylsulfonium hexafluoroantimonate), MPI-103 (4-methoxyphenyliodonium hexafluoroantimonate), BBI-101 (bis(4-tert-butylphenyl)iodonium tetrafluoroborate), BBI-102 (bis(4-tert-butylphenyl)iodonium hexafluorophosphate), BBI-103 (bis(4-tert-phenyl) iodonium hexafluoroantimonate), (manufactured by Midori Chemical Co., Ltd.), and Degacure K126 (bis[4-(diphenylsulfonio)-phenyl]sulfide bishexafluorophosphate) (manufactured by Degussa Ltd.). Among these, UVI-6970, UVI-6974, Adekaoptomer SP-170, SP-171, CD-1012, MPI-103 are particularly preferred. However, this invention is not limited to these examples.

The above-mentioned cationic photo-initiators can be used as component (C) either individually or in combinations of two or more.

The proportion of component (C) in the resin composition of the present invention is 0.1–10% by weight, preferably 0.2–5% by weight, and more preferably 0.3–3% by weight. If the proportion of component (C) is too low, the photo-curing characteristic of the resin composition obtained is insufficient. It is becomes difficult to form a three-dimensional object having sufficient mechanical strength from such a resin composition. Similarly, if the proportion of component (C) is too high, it becomes difficult to obtain the appropriate light capability (curing depth) when the resulting resin composition is used in the photo-fabrication process. In addition, the mechanical strength such as toughness of the three-dimensional object prepared from such a resin composition tends to be reduced.

Optional Components

In addition to the above essential components (A) to (C), other components may be incorporated into the photo-curable resin composition of the present invention as required to the extent that the effects of this invention are not adversely affected. For example, cationically polymerizable organic compounds other than components (A) and (B) may be given. A cationically polymerizable compound is defined as a compound having an organic group which can polymerize or crosslink by photo-irradiation in the presence of an acid or a cation. Such cationically polymerizable organic compounds include epoxy compounds other than component (B), oxolane compounds, cyclic acetal compounds, cyclic lactone compounds, thiirane compounds, thietane compounds, vinylether compounds, spiro-ortho ester compounds which are reaction products of an epoxy compound and lactone, ethylenically unsaturated compounds, cyclic ether compounds, cyclic thioether compounds, and vinyl compounds.

Examples of epoxy compounds other than component (B) are, in particular, epoxy compounds with a molecular weight of less than about 1000 which include alicyclic epoxy compounds such as 3,4-epoxycyclohexylmethyl-3', 4'-epoxy-cyclohexane carboxylate, 2-(3,4-epoxycyclohexyl-5,5-spiro-3,4-epoxy)cyclohexanemethadioxane, bis(3,4-epoxy-cyclohexylmethyl)adipate, vinylcyclohexene oxide, 4-vinyl epoxycyclohexane, bis(3,4-epoxy-6-methylcyclohexylmethyl) adipate, 3,4-epoxy-6-methyl cyclohexyl-3', 4'-epoxy-6'-methyl-cyclohexane carboxylate, methylenebis(3,4-epoxy-cyclohexane), dicyclopentadiene diepoxide, di(3,4-epoxycyclohexylmethyl) ether of ethylene glycol, ethylene-bis(3,4-epoxycyclohexanecarboxylate), epoxidated tetrabenzyl alcohol, lactone modified epoxidated tetrahydrobenzyl alcohol, cyclohexene oxide, bisphenol A diglycidyl ether, bisphenol F diglycidyl ether, bisphenol S diglycidyl ether, bisphenol A diglycidyl ether, bisphenol F diglycidyl ether, bisphenol S diglycidyl ether, hydrogenated bisphenol A diglycidyl ether, hydrogenated bisphenol F diglycidyl ether, hydrogenated bisphenol AD diglycidyl ether, brominated bisphenol A diglycidyl ether, brominated bisphenol F diglycidyl ether, brominated bisphenol S diglycidyl ether, an epoxy novolac resin, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ethers; polyglycidyl ethers of polyether polyol obtained by adding one or more alkylene oxide to aliphatic polyhydric alcohol such as ethylene glycol, propylene glycol, or glycerol; diglycidyl esters of aliphatic long chain dibasic acid; monoglycidyl ethers of aliphatic higher alcohol; monoglycidyl ethers of phenol, cresol, butyl phenol, or polyether alcohol obtained by addition of alkylene oxide to phenol, cresol, or butyl phenol; glycidyl esters of higher fatty acid; epoxidated soybean oil, butyl epoxystearate, octyl epoxystearate, epoxidated polybutadiene, and epoxidated linseed oil.

Other cationically polymerizable compounds which can be additionally used are oxolane compounds such as tetrahydrofuran and 2,3-dimethyltetrahydrofuran; cyclic acetals such as trioxane, 1,3-dioxolane, and 1,3,6-trioxan cyclooctane; cyclic lactones such as β-propiolactone and ε-caprolactone; thiiranes such as ethylene sulfide, 1,2-propylene sulfide, and thioepychlorohydrin; thiethanes such as 3,3-dimethyl thiethane; vinyl ethers such as ethylene glycol divinyl ether, triethylene glycol divinyl ether, and trimethylolpropane trivinyl ether; spiro-ortho esters which are obtained by a reaction of epoxy compound and lactone; ethylenically unsaturated compounds such as vinyl cyclohexane, isobutylene, and polybutadiene; and their derivatives.

The resin composition of the present invention may contain polyols for developing photo-curability of the resin composition, and the shape stability (resistance to deformation with time) and characteristic stability (resistance to change in mechanical performance with time) of the three-dimensional object obtained from the resin composition. The polyether polyol has three or more, preferably from 3 to 6 hydroxyl groups in one molecule. If polyether polyols (polyether diols)having less than three hydroxyl groups are used, the object of developing the photo-curing characteristics can not be achieved and a three-dimensional object with sufficient mechanical strength can not be produced. On the other hand, if polyether polyols having 7 or more hydroxyl groups are used, the elongation and toughness of the three-dimensional object obtained from the resin composition tends to be lower.

Specific examples of suitable polyols are polyether polyols prepared by modifying polyhydric alcohol of more than 3 valences such as trimethylolpropane, glycerol, pentaerythritol, sorbitol, sucrose, quodorol, or the like by a cyclic ether compound such as ethylene oxide (EO), propylene oxide (PO), butylene oxide, tetrahydrofuran, or the like; caprolactone polyols prepared by modifying caprolactone; and polyester polyols prepared by modifying polyesters consisting of a dibasic acid and a diol. Specific examples of such polyether polyols are EO modified trimethylolpropane, PO modified trimethylolpropane, tetrahydrofuran modified trimethylolpropane, caprolactone modified trimethylolpropane, EO modified glycerol, PO modified glycerol, tetrahydrofuran modified glycerol, caprolactone modified glycerol, EO modified pentaerythritol, PO modified pentaerythritol, tetrahydrofuran modified pentaerythritol, caprolactone modified pentaerythritol, EO modified sorbitol, PO modified sorbitol, caprolactone modified sorbitol, EO modified sucrose, PO modified sucrose, and EO modified quodor. Among these, EO modified trimethylolpropane, PO modified trimethylolpropane, caprolactone modified trimethylolpropane, PO modified glycerol, caprolactone modified glycerol, and PO modified sorbitol are preferred. However, the present invention is not limited to these examples.

Specific examples of commercially available products polyols are Sunnix TP-400, Sunnix GP-600, Sunnix GP-1000, Sunnix SP-750, Sunnix GP-250, Sunnix GP-400, Sunnix GP-600 (manufactured by Sanyo Chemical Industries, Ltd.), TMP-3 Glycol, PNT-4 Glycol, EDA-P-4, EDA-P-8 (manufactured by Nippon Nyukazai Co., Ltd.), G-300, G-400, G-700, T-400, EDP-450, SP-600, SC-800 (manufactured by Asahi Denka Kogyo Co., Ltd.), TONE 0301, TONE 0305, TONE 0310 (manufactured by Union Carbide Corp.), and PLACCEL 303, PLACCEL 305, PLACCEL 308 (manufactured by Daicel Chemical Industries, Ltd.).

The resin composition of the present invention may include an ethylenically unsaturated monomer, which is a radically polymerizable compound, to improve the mechanical strength of the cured product and to reduce the time required for fabrication. The ethylenically unsaturated monomer is a compound having ethylenically unsaturated groups (C=C) in the molecule. Given as typical examples of component (C) are mono-functional monomers having one ethylenically unsaturared bond in one molecule, and polyfunctional monomers having two or more ethylenically unsaturated bonds in one molecule.

Examples of mono-functional monomers are acrylamide, (meth)acryloyl morpholine, 7-amino-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethylene glycol (meth) acrylate, t-octyl (meth)acrylamide, diacetone (meth) acrylamide, dimethylaminoethyl (meth)acrylate, diethylaminoethyl (meth)acrylate, lauryl (meth)acrylate, dicyclopentadiene (meth)acrylate, dicyclopentenyloxyethyl (meth)acrylate, dicyclopentenyl (meth)acrylate, N,N-dimethyl (meth)acrylamide tetrachlorophenyl (meth) acrylate, 2-tetrachlorophenoxyethyl (meth)acrylate, tetrahydrofurfuryl (meth)acrylate, tetrabromophenyl (meth) acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth) acrylate, vinyl caprolactam, N-vinyl pyrrolidone, phenoxyethyl (meth)acrylate, butoxyethyl (meth)acrylate, pentachlorophenyl (meth)acrylate, pentabromophenyl (meth)acrylate, polyethylene glycol mono-(meth)acrylate, polypropylene glycol mono-(meth)acrylate, bornyl (meth)acrylate, methyltriethylene diglycol (meth)acrylate, alkoxylated alkyl phenol acrylate, the (poly)caprolactone acrylate ester from methylol-tetrahydrofuran and the (poly)caprolactone acrylate ester from alkylol-dioxane. These compounds may be used either individually or in combinations of two or more.

Among these monofunctional monomers, isobornyl (meth)acrylate, lauryl (meth)acrylate, and phenoxyethyl (meth)acrylate are particularly preferred, although the present invention is not limited to these examples.

Examples of commercially available products of the monofunctional monomers are Aronix M-101, M-102, M-111, M-113, M-117, M-152, TO-1210 (manufactured by Toagosei Chemical Industry Co., Ltd.), KAYARAD TC-110S, R-564, R-128H (manufactured by Nippon Kayaku Co., Ltd.), and Viscoat 192, Viscoat 220, Viscoat 2311HP, Viscoat 2000, Viscoat 2100, Viscoat 2150, Viscoat 8F, Viscoat 17F (manufactured by Osaka Organic Chemical Industry Co., Ltd.)

Preferred examples of polyfunctional monomers are ethylene glycol di(meth)acrylate, dicyclopentenyl di(meth) acrylate, triethylene glycol diacrylate, tetra ethylene glycol di(meth)acrylate, tricyclodecanediyl-dimethylene di(meth) acrylate, tris(2-hydroxyethyl) isocyanurate di(meth) acrylate, tris(2-hydroxyethyl) isocyanurate tri(meth) acrylate, caprolactone modified tris(2-hydroxyethyl) isocyanurate tri(meth)acrylate, trimethylolpropane tri(meth) acrylate, EO modified trimethylolpropane tri(meth)acrylate, PO modified trimethylolpropane tri(meth)acrylate, tripropylene glycol di(meth)acrylate, neopentyl glycol di(meth) acrylate, both terminal (meth)acrylic acid adduct of bisphenol A diglycidyl ether, 1,4-butanediol di(meth)acrylate, 1,6-hexanediol di(meth)acrylate, pentaerythritol tri(meth) acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone modified dipentaerythritol hexa(meth)acrylate, caprolactone modified dipentaerythritol penta(meth) acrylate, ditrimethylolpropane tetra(meth)acrylate, EO modified bisphenol A di(meth)acrylate, PO modified bisphenol A di(meth)acrylate, EO modified hydrogenated bisphenol A di(meth)acrylate, PO modified hydrogenated bisphenol A di(meth)acrylate, EO modified bisphenol F di(meth) acrylate, and phenol novolac polyglycidyl ether. These compounds may be used either individually or in combinations of two or more.

These polyfunctional monomers can be selected from the above-mentioned tri(meth)acrylate compounds, tetra(meth) acrylate compounds, penta(meth)acrylate compounds, and hexa(meth)acrylate compounds. Among these, preferred polyfunctional monomers are trimethylolpropane tri(meth) acrylate, EO modified trimethylolpropane tri(meth)acrylate, PO modified trimethylolpropane tri(meth)acrylate, pentaerythritol tri(meth)acrylate, pentaerythritol tetra(meth) acrylate, dipentaerythritol hexa(meth)acrylate, dipentaerythritol penta(meth)acrylate, dipentaerythritol tetra(meth) acrylate, caprolactone modified dipentaerythritol hexa (meth)acrylate, caprolactone modified dipentaerythritol penta(meth)acrylate, and ditrimethylolpropane tetra(meth) acrylate. However, the present invention is not limited to these examples.

Given as commercially available products of these polyfunctional monomers are SA1002 (manufactured by Mitsubishi Chemical Corp.), Viscoat 195, Viscoat 230, Viscoat 260, Viscoat 215, Viscoat 310, Viscoat 214HP, Viscoat 295, Viscoat 300, Viscoat 360, Viscoat GPT, Viscoat 400, Viscoat 700, Viscoat 540, Viscoat 3000, Viscoat 3700 (manufactured by Osaka Organic Chemical Industry Co., Ltd.), KAYARAD R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-2I, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, R-205 (manufactured by Nippon Kayaku Co., Ltd.), Aronix M-210, M-220, M-233, M-240, M-215, M-305, M-309, M-310, M-315, M-325, M-400, M-6200, M-6400 (manufactured by Toagosei Chemical Industry Co., Ltd.), Light acrylate BP-4EA, BP-4PA, BP-2EA, BP-2PA, DCP-A (manufactured by Kyoeisha Chemical Industry Co., Ltd.), New Frontier BPE-4, TEICA, BR-42M, GX-8345 (manufactured by Daiichi Kogyo Seiyaku Co., Ltd.), ASF-400 (manufactured by Nippon Steel Chemical Co., Ltd.), Ripoxy SP-1506, SP-1507, SP-1509, VR-77, SP-4010, SP-4060 (manufactured by Showa Highpolymer Co., Ltd.), and NK Ester A-BPE-4 (manufactured by Shin-Nakamura Chemical Industry Co., Ltd.).

When compounding an ethylenically unsaturated monomer into a resin composition, a radical photo-initiator is usually added to the resin composition to initiate the radical polymerization reaction of the ethylenically unsaturated monomer. The radical photo-initiator is a compound which decomposes and generates radicals by photo-irradiation and initiates a radical reaction of the ethylenically unsaturated monomer by generating free radicals. Conventionally known radical photo-initiators may be used in the present invention.

Specific examples of radical photo-initiators are acetophenone, acetophenone benzyl ketal, anthraquinone, 1-(4-isopropylphenyl)-2-hydroxy-2-methylpropan-1-one, carbazole, xanthone, 4-chlorobenzo-phenone, 4,4'-diaminobenzophenone, 1,1-dimethoxydeoxybenzoin, 3,3'-dimethyl-4-methoxybenzophenone, thioxanethone compounds, 2-methyl-1-4-(methylthio) phenyl-2-morpholino-propane-2-on, 2-benzyl-2-dimethylamino-1-(4-morpholinophenyl)-butan-1-one, triphenylamine, 2,4,6-trimethylbenzoyl diphenylphosphine oxides, bis (2,6-dimethoxybenzoyl)-2,4,4-tri-methylpentyl-phosphine oxide, benzyl dimethyl ketal, 1-hydroxycyclohexyl phenyl ketone, 2-hydroxy-2-methyl-1-phenylpropane-1-one, fluorenone, fluorene, benzaldehyde, benzoin ethyl ether, benzoin propyl ether, benzophenone, Michler's ketone, 3-methylacetophenone, 3,3', 4,4'-tetra (t-butyl peroxycarbonyl) benzophenone (BTTB), and combined compositions of BTTB and xanthene, thioxanthene, cumarin, ketocumarin or other coloring matter photosensitizer. Among these, benzyl dimethyl ketal, 1-hydroxycyclohexyl phenyl ketone, 2,4,6-trimethylbenzoyl diphenylphosphine oxide, 2-benzyl-2-dimethylamino-1-(4-morpholinophenyl)-butan-1-one, and the like are particularly preferred. However, the present invention is not limited to these examples.

Additives other than the cationically polymerizable compound and the radical photo-initiator, which may be employed in the resin composition as required, are photosensitizers (polymerization promoters) of amine compounds such as triethanolamine, methyl diethanolamine, triethylamine, diethylamine; photosensitizers including thioxantone or its derivatives, anthraquinone or its derivatives, anthracene or its derivatives, perillene and its derivatives, benzophenone, benzoin isopropylether, and the like; and reaction diluents such as vinyl ether, vinyl sulfide, vinyl urethane, or vinyl urea.

Other additives include polymers or oligomers, such as epoxy resins other than the above-mentioned compound having an epoxy group used as component(B) and other epoxy compounds, polyamide, polyamideimide, polyurethane, polybutadiene, polychloroprene, polyether, polyester, styrene-butadiene-styrene block copolymer, petroleum resin, xylene resin, ketone resin, cellulose resin, fluorine oligomer, silicon oligomer, and polysulfide oligomer; polymerization inhibitors such as phenothiazine or 2,6-di-t-butyl-4-methyl phenol, polymerization initiation adjuvants, age resisters, leveling agents, wettability improvers, surfactants, plasticizers, UV stabilizers, UV absorbers, silane coupling agents, pigments, dyes and the like. Also, the resin composition of the present invention may include inorganic fillers, organic fillers, or the like. Specific examples of the above inorganic fillers are solid microparticles of inorganic compounds, such as glass beads, talc microparticles, and silicon oxide, and whiskers of basic magnesium sulfonate, aluminum oxide, or silicon oxide. Specific examples of the above organic fillers are organic solid microparticles of crosslinked polystyrene high polymer, crosslinked polymethacrylate high polymer, crosslinked polyethylene high polymer, and crosslinked polypropylene high polymer. Also, products from such inorganic fillers or organic fillers treated with a silane coupling agent such as aminosilane, epoxysilane, and acrylsilane can be utilized.

Typically, compositions of the present invention will have a dimensional accuracy value of less than 0.15, preferably less than 0.12, more preferable less than 0.10 mm (reference dimensional accuracy test procedure, below).

The curability of the resin compositions of the present invention, as measured by the difference in Young's modulus at different curing doses is substantially the same. The resin composition preferably is formulated to have a Young's modulus after curing of a film, of 80 kg/mm$^2$ or higher, preferably fo 100 kg/mm$^2$ or higher. Generally, the Young's modulus of a cured film will be about 400 kg/mm$^2$ or less. Typically, this Young's modulus is substantially the samewhen exposed to an irradiation dose of 100 and 500 mJ/cm$^2$, which means that the difference between the two Young's modulus values is less than 20%, more preferably less than 10% of the highest value measured. When the resin composition is cured at 100 mJ/cm$^2$ and 500 mJ/cm$^2$, the difference in Young's modulus is typically less than 25, preferably less than 10, and more preferably is 4 kg/mm$^2$ or less (reference test procedure, below).

The tensile elongation of the cured film preferably is between about 10–40%, more preferably, between about 13–30%.

Preparation of the Resin Composition

The resin composition of the present invention can be manufactured by homogeneously blending the above-mentioned components (A) to (C), the optional components which are added as required, and the various additives.

The resulting resin compositions are useful for photocurable resin compositions for photo-fabrication. It is desirable for the photo-curable resin composition of the present invention to possess a viscosity at 25° C. in the range of 50–10,000 cps, preferably 100–5,000 cps.

Photo-fabricating Process

The photo-curable resin composition of the present invention prepared in the manner discussed herein is suitable as a photo-curable (liquid) material used in photo-fabrication processes. Specifically, a three-dimensional object with a desired shape can be obtained by using the photo-fabrication process, including selectively irradiating visible light, ultraviolet light, or infrared light on the photo-curable resin composition of the present invention, and feeding the energy required to cure the resin composition.

Various means may be used to selectively irradiate the photo-curable resin composition with light with no specific limitations. Such light irradiation means include, for example, a laser beam, a means for irradiating the composition with light and the like converged by a lens, mirror, or the like, while scanning, a means irradiating the composition with non-convergent light through a mask provided with a fixed pattern through which light is transmitted, and a means for irradiating the composition with light via a number of optical fibers bundled in a light conductive member corresponding to a fixed pattern. In the means using a mask, a mask electrooptically produces a mask image consisting of a light transmitting area and non-light-transmitting area according to a prescribed pattern by the same theory as that of the liquid crystal display apparatus. A means using a scanning laser beam with a small spot size is preferred for selectively irradiating the resin composition with light, when a resulting three-dimensional object possesses minute parts or when high dimensional accuracy is required to form the three-dimensional object.

In the above means, the irradiated surface (for example, a plane scanned by light) of the resin composition placed in a vessel is either the liquid surface of the resin composition or the interface of the liquid and a translucent wall of the vessel. When the irradiated surface is the liquid surface or the interface of the liquid and the wall of the vessel, the light can be shone directly out of the vessel or through the vessel.

In the above photo-fabrication process, a desired solid shape can be made by curing fixed parts of the resin composition and then moving the light spot from the cured parts to the uncured parts continuously or stepwise to laminate the cured parts. There are various methods for moving the light spot, for example, a method for moving any of the light source, the vessel for the resin composition, or the cured parts of the resin composition. Also there is a method in which a fresh resin composition is supplied to the cured resin composition in the vessel.

Illustrating a typical photo-fabrication process, the surface of a support stage capable of being optionally elevated in the vessel is slightly lowered from the liquid surface to form a thin layer (1) of the resin composition. The thin layer (1) is selectively irradiated with light to form a solid cured resin layer (1'). The resin composition is supplied over this thin layer (1') to form a second thin layer (2), and this thin layer (2) is selectively irradiated with light to laminate a new solid cured resin layer (2') on the thin layer (1'). This step is repeated for a prescribed number of times, with or without changing the pattern subjected to light irradiation, to produce a three-dimensional object consisting of a multiple number of cured resin layers (1') to (n') which are integrally laminated.

The three-dimensional object fabricated in this manner is discharged from the vessel and processed to remove the unreacted photo-curable resin composition remaining on the surface, and washed by a solvent, as required. Given as examples of solvents are an organic solvent which is represented by an alcohol, such as isopropyl alcohol or ethyl alcohol, an organic solvent such as acetone, ethyl acetate, methylethyl ketone, an aliphatic organic solvent such as a terpene, or a low viscosity liquid thermosetting resin or photo-curable resin.

When forming a three-dimensional object with a smooth surface, it is desirable that the cured product be washed using the thermosetting resin or photo-curable resin. In this case, it is necessary to post-cure the product by heat emission or light irradiation depending on the type of solvent used in the washing stage. This post-curing treatment is effective not only for curing the resin remaining uncured on the surface of the laminated body, but also for curing the resin composition which remains uncured inside the laminated body. Thus, the post-curing treatment is also effective in the case where the fabricated three-dimensional object is washed with an organic solvent.

The three-dimensional object obtained in this manner has high mechanical strength, high dimensional accuracy, and excellent heat resistance. Also, the three-dimensional object exhibits high stability in maintaining a fixed shape and lasting stable properties. Therefore, the three-dimensional object prepared from the resin composition is preferably used for trial mechanical parts for confirming the functions.

It is desirable to cover the surface of the three-dimensional object by a heat-curable or photo-curable hard coating agent to improve the strength and heat resistance of the surface. As such a hard coating agent, an organic coating agent such as acrylic resin, epoxy resin, silicone resin, or the like, or an inorganic coating agent can be used. These hard coating agents may be used individually or in combinations of two or more.

EXAMPLES

The present invention will be explained in more detail by way of examples, which are not intended to be limiting of the present invention.

Example 1

According to the formulation shown in Table 1, 90 parts by weight of (1,4-bis[(3-ethyl-3-oxetanylmethoxy)methyl]-benzene as component (A), 9 parts by weight of Epolead PB3600 (epoxydated polybutadiene) as component (B), and 1 part by weight of UVI-6974 (manufactured by Union Carbide Corp.), as component (C), were placed in a vessel equipped with a stirrer and the mixture was reacted with stirring at 60° C. for one hour to prepare a transparent liquid composition.

Examples 2–5

Transparent liquid compositions were prepared in the same manner as in Example 1 according to the formulations shown in Table 1, except that the different components were used.

Comparative Examples 1–5

Transparent liquid compositions (comparative resin compositions) were prepared in the same manner as in Example 1 according to the formulations shown in Table 1, except that the different components and optional components were used. These comparative resin compositions had the following characteristics. Comparative Example 1: component (B) was not used. Comparative Example 2: 3,4-Epoxycyclohexylmethyl-3',4'-epoxyhexane carboxylate was used instead of component (A). Comparative Example 3: component (B) was not used. Comparative Example 4: An epoxy/acryl monomer hybrid-type photocurable resin composition.

Comparative Example 5
Urethane Acrylate Photocurable Resin Composition
   a. Synthesis of urethane acrylate
   3,311 g of isophorone diisocyanate, 10 g of dibutyltin dilaurate, and 3 g of 2,6-di(tert)-butyl-4-methylphenol as a polymerization inhibitor were placed in a reaction vessel equipped with a stirrer. Next, 1,730 g of hydroxyethylacrylate was added to the mixture while controlling the temperature at less than 20° C. After the addition, the resulting mixture was further agitated for one hour. 7,458 g of polyester diol (trade mark: P-1010, manufactured by Kuraray Co., Ltd.) which was consisting of 3-methyl-1,5-pentane diol and adipic acid and which has a number average molecular weight of 1,000 was then added to the mixture, keeping the temperature at 40–50° C. The reaction was terminated after the agitation was further continued for five hours at 50–60° C. to obtain urethane acrylate (U-1) with a number average molecular weight of 1,680.
   b. Preparation of liquid resin composition
   36 parts by weight of urethane acrylate (U-1), 18 parts by weight of tricyclodecanediyldimethylene diacrylate as a reaction diluent, 23 parts by weight of isobornyl acrylate, 16 parts by weight of acryloyl morpholine, and 7 parts by weight of 1-hydroxyphenyl ketone as a photo-initiator were agitated and mixed at 50–60° C. to obtain a transparent liquid resin composition.

Evaluation of the Resin Composition
The photo-curable resin compositions prepared in Examples 1–5 and Comparative Examples 1–5 were evaluated by measuring the curability of the resin solution, the toughness of the cured film, and the fabricating capability of three-dimensional objects according to the following methods for evaluation. The results are shown in Table 2.

Curability of the Resin Solution
The curability of the resin solution shows a degree (curing rate) of polymerization reaction and crosslinking reaction of the resin composition with respect to the energy of photoirradiation. The curing rate has influences on the dynamic properties of the cured products, such as Young's modulus, bending elasticity, and the like. Specifically, excellent photocurability is thought to ensure minimal change in the dynamic properties of the cured product to be produced. In this invention, the curability of the resin solution is evaluated by measuring the Young's modulus of the cured resin film formed by irradiation of lights at different doses.

(1) Preparation of test specimens
A coated film with a thickness of 200 μm was prepared by applying a resin composition to a glass plate using an applicator. The surface of the film was irradiated with ultraviolet light at doses of 100 mJ/cm$^2$ and 500 mJ/cm$^2$ using a conveyer curing apparatus equipped with a metal halide lamp (UB0311-00 type, manufacture by Eye Graphics Co., Ltd.) to prepare a cured resin film. The cured resin film was allowed to stand in an air conditioned room maintained at 23° C. and RH 50% for one hour to produce test specimens. These test specimens were subjected to measurement.

(2) Measurement of Young's modulus
The Young's modulus of the test specimens which had been treated at 23° C. and RH 50% and cured by irradiation with different doses of lights, as noted in Table 2, was measured under the conditions of a drawing rate of 1 mm/min and a bench mark distance of 25 mm using a tension tester (AUTOGRAPH AGS-IKDN, manufactured by Shimazu Corporation). The results are shown in Table 2.

Toughness of the Cured Film
The toughness of the cured product shows resistance to external stress. One indicia of the resins toughness is tensile elongation. In this invention, toughness of the cured film was evaluated by measuring the tensile elongation of the cured resin film.

TABLE 1

|  | Example | | | | | Comparative Example | | | | |
|---|---|---|---|---|---|---|---|---|---|---|
|  | 1 | 2 | 3 | 4 | 5 | 1 | 2 | 3 | 4 | 5 |
| Component A | 90 | 75 | 70 | 63 | 58 | 99 |  | 75 |  |  |
| 1,4-bis[(3-ethyl-3-oxetanylmethoxy)methylbenzene |  |  |  |  |  |  |  |  |  |  |
| Component B | 9 | 24 | 9 | 21 | 18 |  | 24 |  |  |  |
| Epoxidated polybutadiene (Epolead FB3600) |  |  |  |  |  |  |  |  |  |  |
| Component C | 1 | 1 | 1 | 1 | 1 | 1 | 1 | 1 | 1 |  |
| UVI-6974 |  |  |  |  |  |  |  |  |  |  |
| 3,4-epoxycyclohexylmethyl-3',4'-epoxycyclohexane carboxylate |  |  | 20 |  |  |  | 75 | 24 | 49 |  |
| 1,4-butanediol diglycidyl ether |  |  |  |  |  |  |  |  | 21 |  |
| Caprolactone modified trimethylolpropane |  |  |  |  | 8 |  |  |  | 14 |  |
| Trimethylolpropane triacrylate |  |  |  | 14 | 14 |  |  |  | 14 |  |
| 1-hydroxyphenylketone |  |  |  | 1 | 1 |  |  |  | 1 | 7 |
| Urethane acrylate (U-1) |  |  |  |  |  |  |  |  |  | 36 |
| Tricyclodecanediyl dimethylene diacrylate |  |  |  |  |  |  |  |  |  | 18 |
| Isobornyl acrylate |  |  |  |  |  |  |  |  |  | 23 |
| Acryloyl morpholine |  |  |  |  |  |  |  |  |  | 16 |

(1) Preparation of test specimen
A coated film with a thickness of 200 μm was prepared by applying a resin composition to a glass plate using an applicator. The surface of the film was irradiated with ultraviolet light at a dose of 500 mJ/cm$^2$ using a conveyer curing apparatus equipped with a metal halide lamp. The irradiation was terminated before the resin composition was completely cured to prepare a half-cured resin film. Next, the half cured resin film was peeled from the glass plate and placed on releasable paper. The side opposite to that first cured by irradiation was irradiated with ultraviolet light at a dose of 500 mJ/cm$^2$ to prepare a completely cured resin film.

The cured resin film was allowed to stand in an airconditioned room maintained at a temperature of 23° C. and a humidity of 50% for 24 hours.

(2) Measurement of tensile elongation

The tensile elongation of the test specimen was measured at a temperature of 23° C. under a humidity of 50% and the conditions of a drawing rate of 1 mm/min and a bench mark distance of 25 mm using the above tension tester. The results are shown in Table 2.

Fabricating Capability of Three-dimensional Objects

The fabricating capability of the three-dimensional objects was evaluated by measuring the dimensional accuracy of the three-dimensional object prepared from each resin composition and time required for the fabrication.

(1) Fabrication of three-dimensional object

Using an photo-fabrication apparatus (Solid Creator SCS-1000HD, manufactured by Sony Corporation), the resin compositions prepared in the Examples 1–5 and Comparative Examples 1–5 were fabricated according to the following conditions to produce three-dimensional objects each having an H-shape configuration as shown in the Figure. With respect to the target dimension of the product, the two columns and the horizontal beam constituting the H shaped object 10 were all made of a prism with a 6.4 mm×6.4 mm square cross section. The lengths of the columns 11 & 12 and horizontal beam 13 were 44.5 mm and 88.8 mm, respectively. Other target dimensions are shown in the Figure.

The fabricated three-dimensional object was allowed to stand in an air-conditioned room maintained at 23° C. and RH 50% to condition.

(a) Fabricating conditions (i) Laser beam intensity on the liquid surface: 10 mW
(ii) Scanning velocity: the optimum velocity for the cured depth of the composition to be 0.15 mm.
(iii) Thickness of cured resin layer: 0.1 mm
(iv) Number of lamination: 445

(2) Measurement of dimensional accuracy of the fabricated three-dimensional object To determine the molding accuracy of the three-dimensional object 10 with the H-shape, the actual widths 14 and 16 at positions 14*a* and 16*a* were measured using calipers having a measuring accuracy of 0.01 mm to calculate the differences between the lengths 14 and 15, measured at 15*a*, and the lengths 16 and 15, similarly measured at 15*a*, according to the equations (I) and (II) illustrated below. The dimensional accuracy was evaluated based on these differences. The results are shown in Table 2.

Dimensional difference between A and B=(A−B) (I)
Dimensional difference between C and B=(C−B) (II)

(3) Measurement of the time required for fabrication

The time required for fabricating the three-dimensional object with the H-shape shown in the FIG. 1 using the above photo-fabrication apparatus was measured. The results are shown in Table 2.

TABLE 2

|  | Example | | | | | Comparative Example | | | | |
| --- | --- | --- | --- | --- | --- | --- | --- | --- | --- | --- |
|  | 1 | 2 | 3 | 4 | 5 | 1 | 2 | 3 | 4 | 5 |
| [Curability of resin solution] Young's modulus of cured film (kg/mm$^2$) | | | | | | | | | | |
| Irradiation dose 100 mJ/cm$^2$ | 112 | 115 | 134 | 113 | 106 | 17 | 25 | 134 | 60 | 104 |
| 500 mJ/cm$^2$ | 115 | 119 | 137 | 116 | 107 | 42 | 63 | 137 | 132 | 104 |
| [Toughness of cured product] Tensile elongation of cured film (%) | 17 | 18 | 17 | 19 | 18 | 5 | 13 | 7 | 6 | 30 |
| [Fabrication capability] Dimensional accuracy (mm) | | | | | | | | | | |
| Difference A − B | −0.10 | −0.09 | −0.09 | −0.10 | −0.09 | — | −0.09 | −0.15 | −0.07 | −0.32 |
| C − B | 0.07 | 0.08 | 0.08 | 0.09 | 0.08 | — | 0.11 | 0.24 | 0.10 | 0.65 |
| Time for fabrication (hour) | 8.1 | 8.5 | 9.0 | 8.5 | 8.5 | * | 35 | 8.5 | 22 | 7.2 |

* The Green strength of the fabricated product was so low that a target three-dimensional object could not be produced.

As clear from Table 2, difference in the Young's modulus of cured films prepared from the resin solutions containing the resin compositions of Examples 1–5 was small when the resin compositions were cured by irradiation with lights at doses of 100 mJ/cm$^2$ and 500 mJ/cm$^2$, demonstrating show excellent curability of the resin composition of the present invention. Also, the Young's modulus of the cured films exceeded 100 kg/mm$^2$, indicating that the cured products from these resin compositions exhibit sufficient mechanical strength for photo-fabricating applications. On the other hand, the Young's modulus of the cured film of the resin composition prepared in the Comparative Example 1 excluding component (B) was so small that no sufficient curability and mechanical strength required for photo-fabricating applications were provided. The resin composition prepared in the Comparative Example 2 excluding component (A) exhibited only insufficient curability and mechanical strength because the Young's modulus of a cured film of the resin composition was small similarly to that obtained in the Comparative Example 1. The Young's modulus of the photocurable resin composition of the epoxy/acryl monomer hybrid type, which was prepared in the Example 4, was so low that the curability of the resin composition was insufficient for photo-fabricating applications.

The tensile elongation of the cured films prepared from the resin compositions of the Examples 1–5 ranged from 17% to 19%, indicating sufficient toughness for photo-fabricating applications. On the other hand, the tensile elongation of the resin compositions excluding component (B) which were prepared in the Comparative Examples 1 and 3 was 5% and 7% respectively. Therefore, the toughness of the resin compositions excluding component (B) was insufficient for photo-fabricating applications. In addition, the tensile elongation of the resin composition prepared in the Comparative Example 4 was 6% so that sufficient toughness for photo-fabricating applications could not be provided.

Illustrating the photo-fabricated products of the photocurable resin compositions used for photo-fabrication, which were prepared in the Examples and the Comparative Examples, the photocurable resin compositions prepared in the Examples 1–5 and the urethane acrylate type photocurable resin composition prepared in the comparative Example 5 required less than 10 hours to be optically molded. On the other hand, for the resin composition prepared in the Comparative Example 1, the strength of the resin cured by laser irradiation, which was called "Green strength", was so small that a target three-dimensional object could not be produced. Also, the resin compositions prepared in the Comparative Examples 2 and 4 required more than 20 hours to be optically molded.

Concerning the dimensional accuracy, excellent fabricated products with small dimensional differences could be produced from the resin compositions prepared in the Examples 1–5 and the Comparative Examples of 2 and 4. However, the fabricated products produced from the Comparative Examples 3 and 5 exhibited large dimensional differences so that sufficient dimensional accuracy required for photo-fabrication could not be obtained.

As clear from the above illustrations, the photocurable resin composition used for photo-fabrication in the present invention has excellent photocurability, by which the resin composition can be promptly cured by irradiation with lights so that the time required for fabrication can be reduced. Also, shrinkage during curing is so small, so that three-dimensional objects having high dimensional accuracy and excellent mechanical characteristics, especially excellent toughness, can easily be prepared.

What is claimed is:

1. A photocurable resin composition used for photo-fabrication of three-dimensional objects comprising;
    (A) an oxetane compound,
    (B) an epoxy compound selected from the group consisting of
        (i) expoxidized polymers of conjugated diene monomers,
        (ii) expoxidized copolymers of conjugated diene monomers and compounds having an ethylenically unsaturated bond,
        (iii) expoxidized copolymers of diene monomers and compounds having an ethylenically unsaturated bond, and
        (iv) expoxidized natural rubber, and
    (C) a cationic photo-initiator.

2. The resin composition of claim 1, wherein the oxetane compound is a compound comprising two or more oxetane rings.

3. The resin composition of claim 1, wherein the oxetane compound is selected from the group consisting of (3-ethyl-3-oxetanylmethoxy)methylbenzene, 1,4-bis[(3-ethyl-3-oxetanylmethoxy)-methyl]benzene, 1,2-bis(3-ethyl-3-oxetanylmethoxy)ethane, and trimethylolpropane tris(3-ethyl-3-oxetanylmethyl) ether.

4. The resin composition of claim 1, wherein the oxetane compound is a compound represented by formula (16):

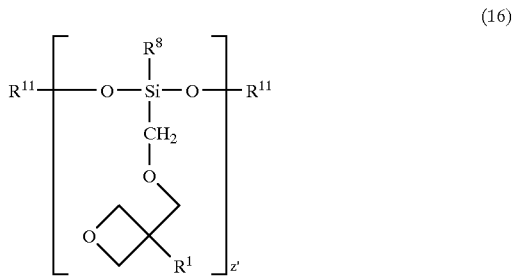

wherein $R^1$ constitutes the remainder of a molecule; $R^8$ represents an alkyl group having from 1 to 4 carbon atoms such as a methyl group, ethyl group, propyl group, butyl group, or aryl group having from 6 to 18 carbon atoms such as a phenyl group, or naphthyl group; $R^{11}$ represents an alkyl group having from 1 to 4 carbon atoms such as a methyl group, ethyl group, propyl group, butyl group, or a trialkylsilyl group, wherein the alkyl groups may be either the same or different and have from 3 to 12 carbon atoms, such as a trimethylsilyl group, triethylsilyl group, tripropylsilyl group, or tributylsilyl group; and z' is an integer from 1 to 10.

5. The resin composition of claim 1, wherein the epoxy compound has a number average molecular weight of 1,000–20,000.

6. The resin composition of claim 5, wherein the composition further comprises an epoxy compound with a number average molecular weight of less than 1,000.

7. The resin composition of claim 1, wherein the photocurable composition comprises, relative to the total weight of the composition:
    about 40–96% by weight of (A);
    about 3–50% by weight of (B); and
    about 0.1–10% by weight of (C).

8. The resin composition of claim 1, wherein the composition further comprises a polyol.

9. The resin composition of claim 1, wherein the composition further comprises an ethylenically unsaturated compound which is a radically polymerizable compound and a radical photo-initiator.

10. The resin composition of claim 1, wherein the resin composition when cured has Young's modulus of 80 kg/mm$^2$ or higher.

11. The resin composition of claim 1, wherein said resin composition has substantially the same Young's Modulus when cured at an irradiation dose of 100 mJ/cm$^2$ as at an irradiation dose of 500 mJ/cm$^2$.

12. The resin composition of claim 1, wherein said resin composition has a difference in Young's modulus, when cured at an irradiation dose 100 mJ/cm$^2$ and 500 mJ/cm$^2$, of less than 10 kg/mm$^2$.

13. The resin composition of claim 1, wherein the resin composition when cured has a tensile elongation of between about 10–40%.

14. A three-dimensional object comprising a cured photocurable resin composition having:
    (A) an oxetane compound,
    (B) an epoxy compound selected from the group consisting of
        (i) expoxidized polymers of conjugated diene monomers,
        (ii) expoxidized copolymers of conjugated diene monomers and compounds having an ethylenically unsaturated bond, (iii) expoxidized copolymers of diene monomers and compounds having an ethylenically unsaturated bond, and (iv) expoxidized natural rubber, and (C) a cationic photo-initiator.

15. A process for photo-fabricating a three-dimensional object comprising selectively curing a photo-curable resin wherein said photo-curable resin comprises, (A) an oxetane compound, (B) an epoxy compound selected from the group consisting of (i) expoxidized polymers of conjugated diene monomers, (ii) expoxidized copolymers of conjugated diene monomers and compounds having an ethylenically unsaturated bond, (iii) expoxidized copolymers of diene monomers and compounds having an ethylenically unsaturated bond, and (iv) expoxidized natural rubber, and (C) a cationic photo-initiator.

* * * * *